(12) United States Patent
Han et al.

(10) Patent No.: US 6,781,899 B2
(45) Date of Patent: Aug. 24, 2004

(54) SEMICONDUCTOR MEMORY DEVICE AND TEST METHOD THEROF

(75) Inventors: Gong-Heum Han, Yongin-shi (KR); Choong-Keun Kwak, Kyunggi-do (KR); Hyou-Youn Nam, Kyunggi-do (KR)

(73) Assignee: Samsung Electronics, Co., LTD, Kyungki-do (KR)

( * ) Notice: Subject to any disclaimer, the term of this patent is extended or adjusted under 35 U.S.C. 154(b) by 110 days.

(21) Appl. No.: 10/202,272

(22) Filed: Jul. 24, 2002

(65) Prior Publication Data

US 2003/0076724 A1 Apr. 24, 2003

(30) Foreign Application Priority Data

Oct. 23, 2001 (KR) .......................................... 2001-65334

(51) Int. Cl.⁷ .............................. G11C 29/00; G11C 7/00
(52) U.S. Cl. ................................... 365/201; 365/189.03
(58) Field of Search ............................. 365/201, 189.03

(56) References Cited

U.S. PATENT DOCUMENTS

| | | | | |
|---|---|---|---|---|
| 5,852,579 A | * | 12/1998 | Arcoleo et al. | 365/189.05 |
| 5,936,892 A | * | 8/1999 | Wendell | 365/189.03 |
| 6,385,081 B1 | * | 5/2002 | Shiomi | 365/154 |

* cited by examiner

*Primary Examiner*—David Nelms
*Assistant Examiner*—Tu-Tu Ho
(74) *Attorney, Agent, or Firm*—F. Chau & Associates, LLC

(57) ABSTRACT

A semiconductor memory device employs a power supply system in which a first power supply voltage supplied to a cell area is separated from a second power supply voltage supplied to a peripheral circuit area. Particularly, during a wafer burn-in test operation mode, the first power supply voltage supplied to the cell area is higher than the second power supply voltage supplied to the peripheral circuit area. If a wafer burn-in test operation is performed under the second power supply system, a DC current path formed by a latch-up phenomenon of a memory cell can be shut off.

41 Claims, 7 Drawing Sheets

VCC1=5V
VCC2=3~4V

SEMICONDUCTOR MEMORY DEVICE AND TEST METHOD THEROF

This application claims priority to Korean Patent Application No. 2001-65334, filed on Oct. 23, 2001, the contents of which are herein incorporated by reference in their entirety.

BACKGROUND OF THE INVENTION

1. Field of the Invention

The present invention relates to memory devices and, more particularly, to a semiconductor memory device to which two power supply voltages are applied.

2. Discussion of Related Art

A block diagram of a conventional SRAM is illustrated in FIG. 1.

Referring to FIG. 1, a plurality of wordlines WL1, WL2, WL3, WL4, . . . are provided in a memory cell array 1. A plurality of bitlines BL1, $\overline{BL1}$, BL2, $\overline{BL2}$, . . . are arranged to intersect these wordlines in the memory cell array 1.

Adjacent bitlines constitute bitline pairs. For example, bitlines BL1 and $\overline{BL1}$ constitute a bitline pair, and bitlines BL2 and $\overline{BL2}$ constitute a bitline pair. A memory cell 2 (shown by a hatched potion in FIG. 1) is arranged at respective intersections of the wordlines and the bitlines. A power supply line 3 and a ground line 4 are connected to the memory cell array 1. A power supply voltage VCC (hereinafter this voltage is regarded as a high or 'H' level voltage) applied to the supply line 3 and a ground voltage VSS (hereinafter this voltage is regarded as a low or 'L' level voltage) applied to the ground line 4 are applied to each memory cell 2. A row decoder 5, a column decoder 6, and an input/output circuit 8 are provided in relation to the memory cell array 1. The row decoder 5 decodes a row address applied through an address input line 7 to select one of the wordlines, and applies a voltage of H level to the selected wordline. The input/output circuit 8 includes a plurality of switching circuits each corresponding to their bitline pairs, and one or a plurality of sense amplifiers disposed between an input/output line 9 and the switching circuits. The column decoder 6 decodes a column address applied through the address input line 7 to select one of the switching circuits. The input/output line 9 is connected to a data input/output pad (not shown) through an output driver circuit (not shown). Therefore, one of the memory cells 2 is selected by the row decoder 5 and the column decoder 6.

Referring to FIG. 2, the memory cell 2 of FIG. 1 includes NMOS transistors 21, 22, 25, and 26 and PMOS transistors 23 and 24. The NMOS transistors 25 and 26 act as transfer gates, and the PMOS transistors 23 and 24 act as load elements. The NMOS transistor 21 is coupled between an ND1 node and a ground line 4, and the NMOS transistor 22 is coupled between an ND2 node and the ground line 4. Gate electrodes of the NMOS transistors 21 and 22 are connected to the ND2 and ND1 nodes, respectively. The PMOS transistor 23 is coupled between the power supply line 3 and the ND1 node, and the PMOS transistor 24 is coupled between the power supply line 3 and the ND2 node. Gate electrodes of the PMOS transistors 23 and 24 are connected to the ND2 and ND1 nodes, respectively. The NMOS transistor 25 is coupled between a bitline BLn and the ND1 node, and the NMOS transistor 26 is coupled between a bitline $\overline{BLn}$ and the ND2 node. Gate electrodes of the NMOS transistors 25 and 26 are commonly coupled to a wordline WLn.

A writing operation of the SRAM will be described hereinbelow with reference to FIG. 1 and FIG. 2.

A wordline WLn is selected by the row decoder 5. A voltage of H level is applied to the wordline WLn, turning on the transistors 25 and 26. Out of the switching circuits in the input/output circuit 8, a switching circuit corresponding to the bitline pair BLn and $\overline{BLn}$ is rendered conductive by the column decoder 6. Assuming that as write data, a voltage of L level is applied to the bitline $\overline{BLn}$ and a voltage of H level is applied to the bitline BLn, the ND1 node of FIG. 2 attains an H level and the NMOS transistor 22 is turned on. As a result, the potential at the ND2 node is at an L level and the NMOS transistor 21 is turned off. Because the ND1 node is at H level and the ND2 node is at L level, the PMOS transistor 23 is turned on and the PMOS transistor 24 is turned off. A potential at the ND1 node is pulled up through the PMOS transistor 23 acting as a load element to maintain the H level. The potential of the ND1 node is set to H level, and the potential of the node ND2 is set to L level. This state is regarded as the state in which the memory cell 2 stores logic "1". On the other hand, assuming that a voltage of L level is applied to the bitline BLn and a voltage of the H level is applied to the bitline $\overline{BLn}$, an operation opposite to the above operation is carried out. That is, the NMOS transistor 21 is turned on and the NMOS transistor 22 is turned off. Accordingly, the potential at the ND1 node is set to L level, and the potential at the ND2 node is set to H level. This state is regarded as the state in which logic "0" is stored.

The SRAM shown in FIG. 1 is divided into a cell area (e.g., a memory cell array) for storing data, a peripheral circuit area (row and column selection circuits, switch circuits, sense amplifiers, write drivers, data input/output buffers, etc.) for writing/reading data to/from a memory cell, and a data input/output area (e.g., pad drivers) for connecting the SRAM with an external interface. A first power supply voltage is applied to the cell area and the peripheral circuit area, while a second power supply voltage is applied to the data input/output area. The first power supply voltage has the same level as that of the second power supply voltage in a normal write/read operation mode. However, the first and second power supply voltages are externally applied through different power supply pins. An example of a memory device employing this power supply method is disclosed in the specification "K6T8008C2M" published by Samsung Electronics Co., Ltd., in February 2002. A power supplied to a memory is divided according to circuit areas, which is aimed at preventing poor operations of circuits in the peripheral circuit area and checking an overcurrent region. Generally, the poor operations occur when a power supply voltage applied to a data input/output area is lowered (e.g., noise) by large consumed current in a chip operation. The overcurrent region can be checked by measuring currents respectively used in the data input/output areas.

In the case of an SRAM having a divided power supply system, a wafer burn-in test operation mode (hereinafter referred to as "burn-in test operation mode") suffers from several problems. The term "burn-in test" means that failure of a weak cell is induced in an early stage by applying excessive stresses to the memory cell with the use of a high power supply voltage. In the burn-in test operation mode, a relatively higher voltage (e.g., 5V or higher) is applied to an SRAM compared with a normal operation mode. In this case, the memory cell may be damaged by an instantaneous overcurrent. This will be described more fully with reference to FIG. 3.

Since a power supply voltage is equivalently applied to a cell area and a peripheral circuit area, a high voltage of 5V is applied to a wordline WLn, a bitline BLn or $\overline{BLn}$, and a memory cell in the burn-in test operation mode, as shown in FIG. 3. It is assumed that as write data, a voltage of 0V is applied to the bitline BLn and a voltage of 5V is applied to the bitline $\overline{BLn}$. In this assumption, an ND1 node must be set to a voltage of L level and an ND2 node must be set to a voltage of H level. In the wafer burn-in test operation, the amount of current flowing through a resistance element of a ground line 4 is higher than in a normal write operation. Thus, the resistance element prevents the ND1 node from sufficiently attaining to a ground voltage. The ND1 node is set to a voltage corresponding to the voltage drop caused by the resistance element of the ground line 4, so that the NMOS transistor 22 is not sufficiently turned off. For that reason, a DC current path is formed between a power supply line 3 and the ground line 4 through the PMOS transistor 24 and the NMOS transistor 22. Since, similar to the ND1 node, the ND2 node is not sufficiently set to a voltage of H level, a DC current path is also formed between the power supply line 3 and the ground line 4 through the PMOS transistor 23 and the NMOS transistor 21.

A latch-up phenomenon, which tends to occur during the burn-in test operation mode, causes the DC current paths to be continuously formed between the power supply line 3 and the ground line 4. Therefore, in the burn-in test operation mode, normal cells as well as weak cells may be damaged by an instantaneous overcurrent that is generated by the latch-up phenomenon.

SUMMARY OF THE INVENTION

The present invention addresses the above-described disadvantages. It is a feature of the invention to provide a semiconductor memory device which prevents a latch-up phenomenon of a memory cell in a wafer burn-in test operation mode.

Another feature of the invention is to provide a semiconductor memory device having a power supply system in which a first power supply voltage is applied to a cell area and a data input/output area and a second power supply voltage is applied to a peripheral circuit area.

Still another feature of the invention is to provide a semiconductor memory device which efficiently applies a stress to memory cells.

Further another feature of the invention is to provide a test method which efficiently applies a stress to memory cells.

To achieve these and other features, the present invention provides a novel semiconductor memory device. According to an aspect of the invention, a semiconductor memory device includes a storage area for storing data, a peripheral circuit area for writing/reading data to/from the storage area, and a data input/output area for interfacing with external devices. The data input/output area is coupled to the peripheral circuit area. During a wafer burn-in test operation mode, a first operation voltage is applied to the storage area and a second operation voltage is applied to the peripheral circuit area. The second operation voltage is lower than the first operation voltage. In this case, the first operation voltage is used as an operation voltage of the data input/output area. In the case where a normal write/read operation is carried out, the first operation voltage is equal to the second operation voltage.

According to another aspect of the invention, a semiconductor memory device includes a first power supply pad, a second power supply pad, a cell area for storing data, a peripheral circuit area for writing/reading data to/from the cell area, a data input/output area for interfacing with external devices, a first power supply line for transferring a first power supply voltage applied to the first power supply pad to the cell area, a second power supply line for transferring a second power supply voltage applied to the second power supply pad to the peripheral circuit area, and a third power supply line for transferring the first power supply voltage applied to the first power supply pad to the data input/output area. The data input/output area is coupled to the peripheral circuit area. The first and third power supply lines are coupled to the first power supply pad, and the second power supply line is coupled to the second power supply pad. During a wafer burn-in test operation mode, the first power supply voltage applied to the first power supply pad is higher than the second power supply voltage applied to the second power supply pad.

According to still another aspect of the invention, a semiconductor memory device, i.e., an SRAM, includes a first power supply pad, a second power supply pad, a cell area for storing data, a peripheral circuit area for writing/reading data to/from the cell area, and a data input/output area for interfacing with external devices. The data input/output area is coupled to the peripheral circuit area. A first power supply line is disposed to transfer a first power supply voltage applied to the first power supply pad to the peripheral circuit area. A second power supply line is disposed to transfer a second power supply voltage applied to the second power supply pad to the data input/output area. A third power supply line is disposed to transfer one of the first and second power supply voltages to the cell area. In response to a test enable signal for indicating a wafer burn-in test operation mode, a switching circuit connects the third power supply line with one of the first and second power supply pads. When the test enable signal is activated, the third power supply line is coupled to the second power supply pad. When the test enable signal is inactivated, the third power supply line is coupled to the first power supply pad. Particularly, during the wafer burn-in test operation mode, the second power supply voltage applied to the second power supply pad is higher than the first power supply voltage applied to the first power supply pad.

According to a further aspect of the invention, the invention provides a test method of a semiconductor device including a storage area for storing data, a peripheral circuit area for writing/reading data to/from the storage area, and a data input/output area that is coupled to the peripheral circuit area and interfaces with external devices. In order to carry out the test method, the semiconductor memory device enters a wafer burn-in test operation mode. Data is written to the storage area by applying a first operation voltage to the storage area and applying a second operation voltage to the peripheral circuit area. In this case, the second operation voltage is lower than the first operation voltage.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION OF THE PREFERRED EMBODIMENTS OF THE INVENTION

A semiconductor memory device made according to the present invention employs a power supply system in which power supply voltages applied to a cell area and a peripheral circuit area are divided. Particularly, during a wafer burn-in test operation mode, a first power supply voltage (e.g., 5V or higher) applied to the cell area is higher than a second power supply voltage (e.g., 3V or higher) applied to the peripheral circuit area. Selectively, the first power supply voltage applied to the cell area is used as an operation voltage of drivers for driving data pads. In the case where a wafer burn-in test operation is carried out under this power supply system, a DC current path formed by a latch-up phenomenon of a memory cell is shut off to prevent normal memory cells from being damaged in the wafer burn-in operation mode. This will be explained in detail later.

Figure 1:
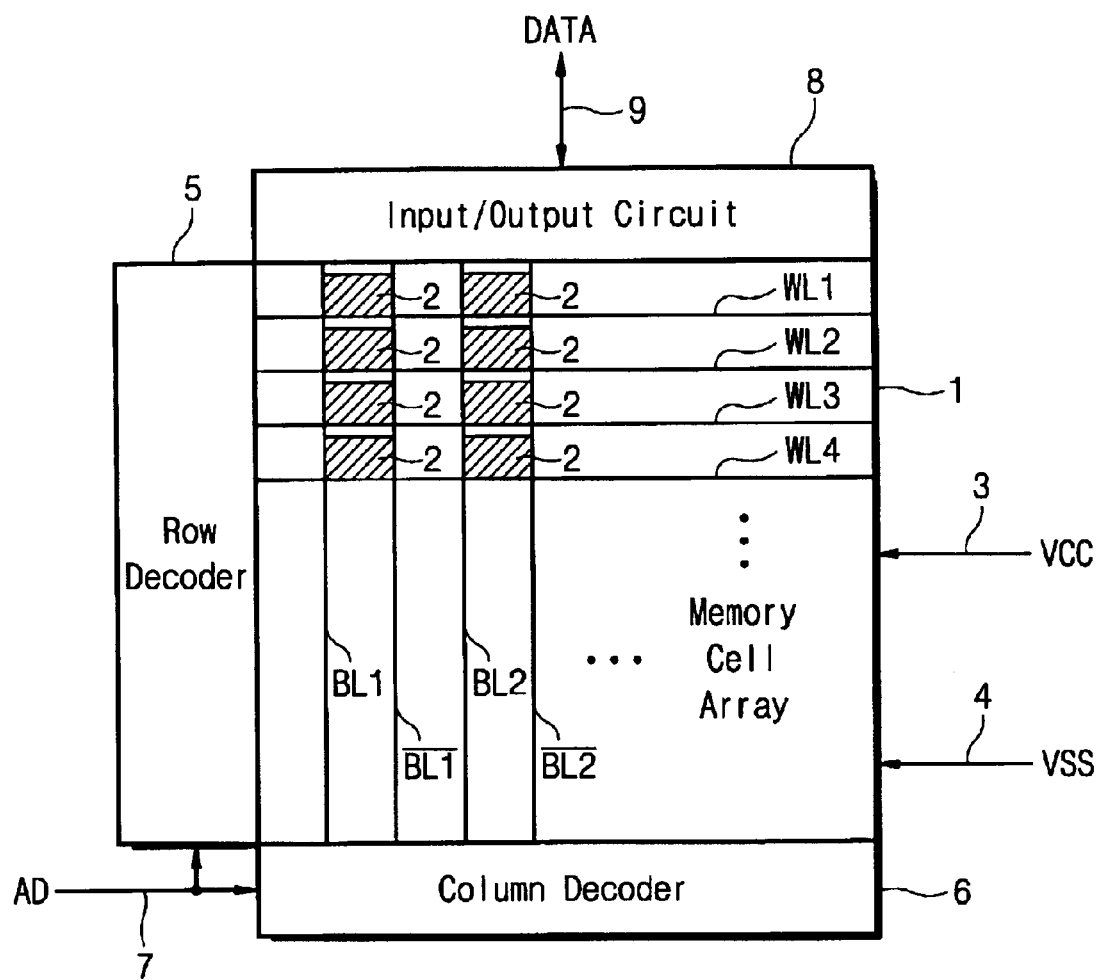
FIG. 1 is a block diagram of a conventional semiconductor memory device.
Figure 2:
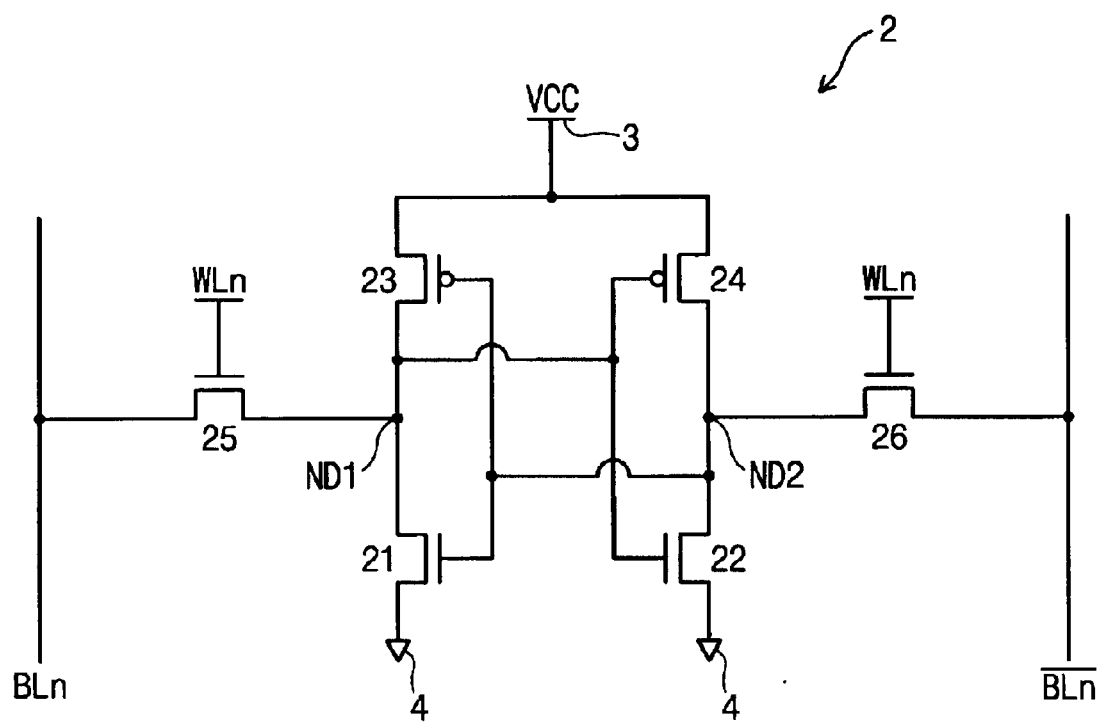
FIG. 2 is a circuit diagram of a memory cell shown in FIG. 1.
Figure 3:
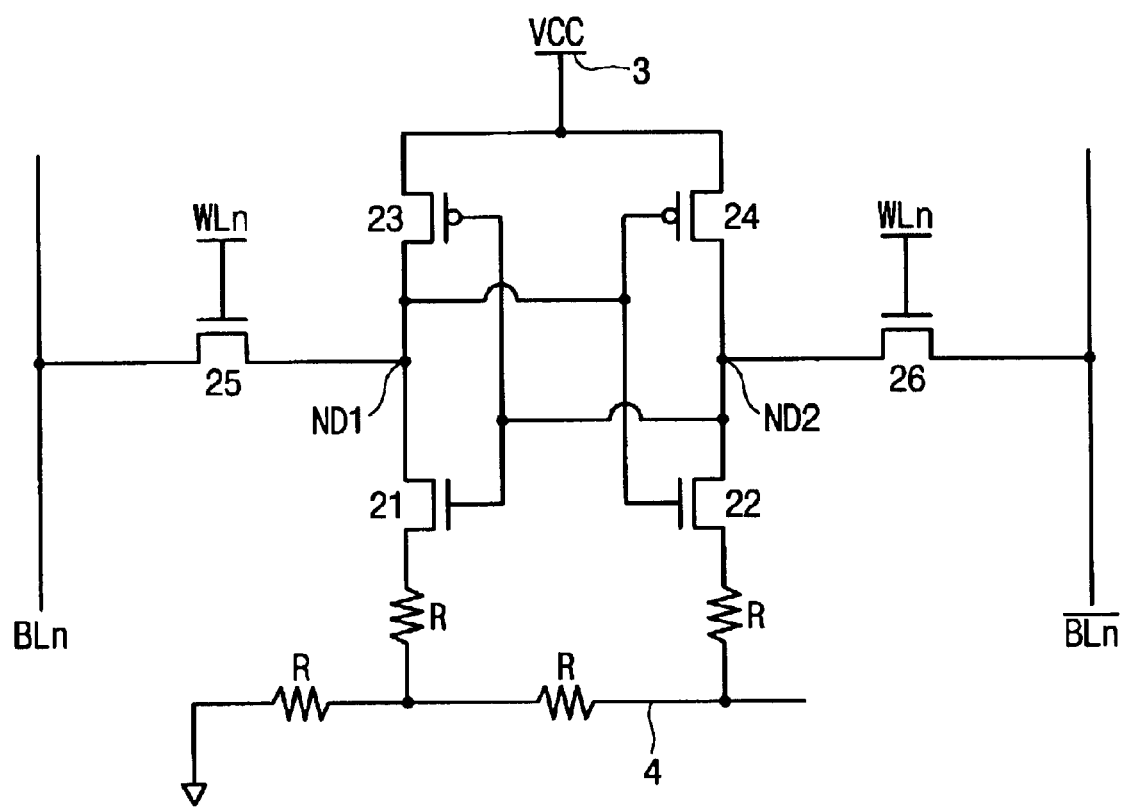
FIG. 3 is a circuit diagram of a resistance element of a ground line coupled to a memory cell.
Figure 4:
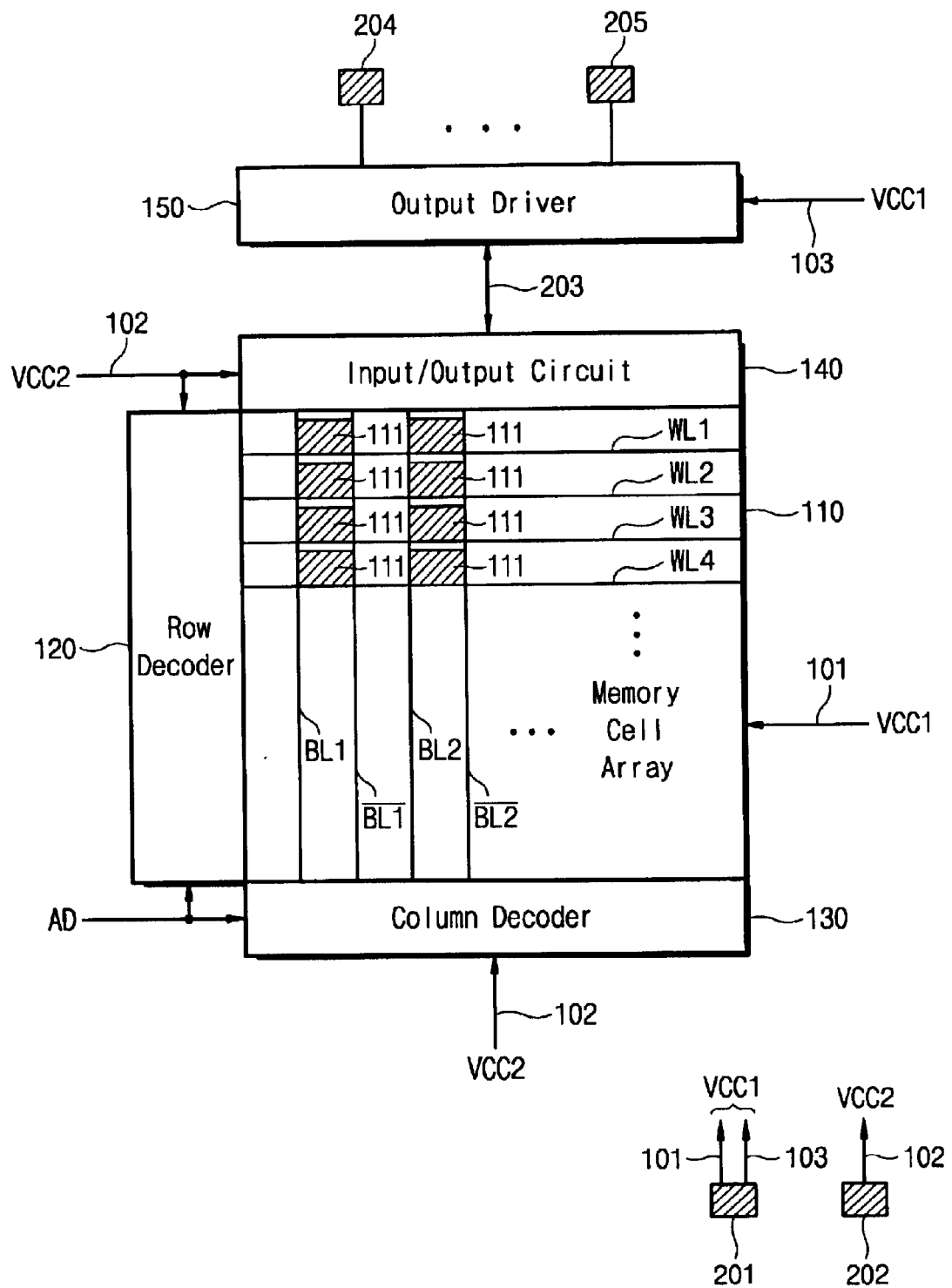
FIG. 4 is a block diagram of a semiconductor memory device according to a preferred embodiment of the present invention.

A block diagram of a semiconductor memory device according to a preferred embodiment of the present invention is illustrated in FIG. 4. Although the present invention will described using an SRAM as the semiconductor memory device, a person skilled in the art will appreciate that the invention is not limited to the SRAM.

Referring to FIG. 4, a plurality of wordlines WL1, WL2, WL3, WL4, . . . are provided in a memory cell array 110. A plurality of bitlines BL1, $\overline{BL1}$, BL2, $\overline{BL2}$, . . . are arranged to intersect these wordlines in the memory cell array 110.

Adjacent bitlines constitute bitline pairs. For example, bitlines BL1 and $\overline{BL1}$ constitute a bitline pair, and bitlines BL2 and $\overline{BL2}$ constitute a bitline pair. A memory cell 111 is arranged at respective intersections between the wordlines and the bitlines. As an operation voltage, a first power supply voltage VCC1, which is externally applied through a power supply pad 201, is supplied to the memory cell array 110.

A row decoder 120, a column decoder 130, and an input/output circuit 140 are provided in association with the memory cell array 110. They belong to the peripheral circuit area. The row decoder 120 decodes a row address to select one of the wordlines, and supplies the selected wordline with a second power supply voltage VCC2 received through a power supply pad 202 to the selected wordline. The input/output circuit 140 includes a plurality of switching circuits each corresponding to their bitline pairs, and one or a plurality of sense amplifiers disposed between an input/output line 203 and the switching circuits. The column decoder 130 decodes a column address to select one of the switching circuits. The input/output line 203 acts as a data input/output area that is coupled to data output pads 204 and 205 through an output driver circuit 150. One of a plurality of memory cells 111 is selected by the row decoder 120 and the column decoder 130.

As shown in FIG. 4, the first power supply voltage VCC1 applied to the power supply pad 201 is provided to the memory cell array 110, as a cell area, and the output driver circuit 150, as a data input/output area, through corresponding power lines 101 and 103. The second power supply voltage VCC2 applied to the power supply pad 202 is provided to the row decoder 120, the column decoder 130, and the input/output circuit 140, as a peripheral circuit area, through power supply line 102. Although not shown in the drawing, the power supply pads 201 and 202 will be bonded to their corresponding power pins. In a normal operation mode, the first power supply voltage VCC1 has the same level as that of the second power supply voltage VCC2. On the other hand, in a wafer burn-in test operation mode, the first power supply voltage VCC1 has a level which is different from that of the second power supply voltage VCC2. For example, in the normal operation mode, the first and second power supply voltages VCC1 and VCC2 are 3V. In the wafer burn-in test operation mode, the first power supply voltage VCC1 is about 5V and the second power supply voltage is about 3V to 4V, as shown in FIG. 5.

Although ground lines each corresponding to their power supply lines 101, 102, and 103 are not shown in the drawing so as to simplify the drawing, it will be understood to a person skilled in the art that the ground lines are arranged by the same manner as the power supply lines 101, 102, and 103.

Figure 5:
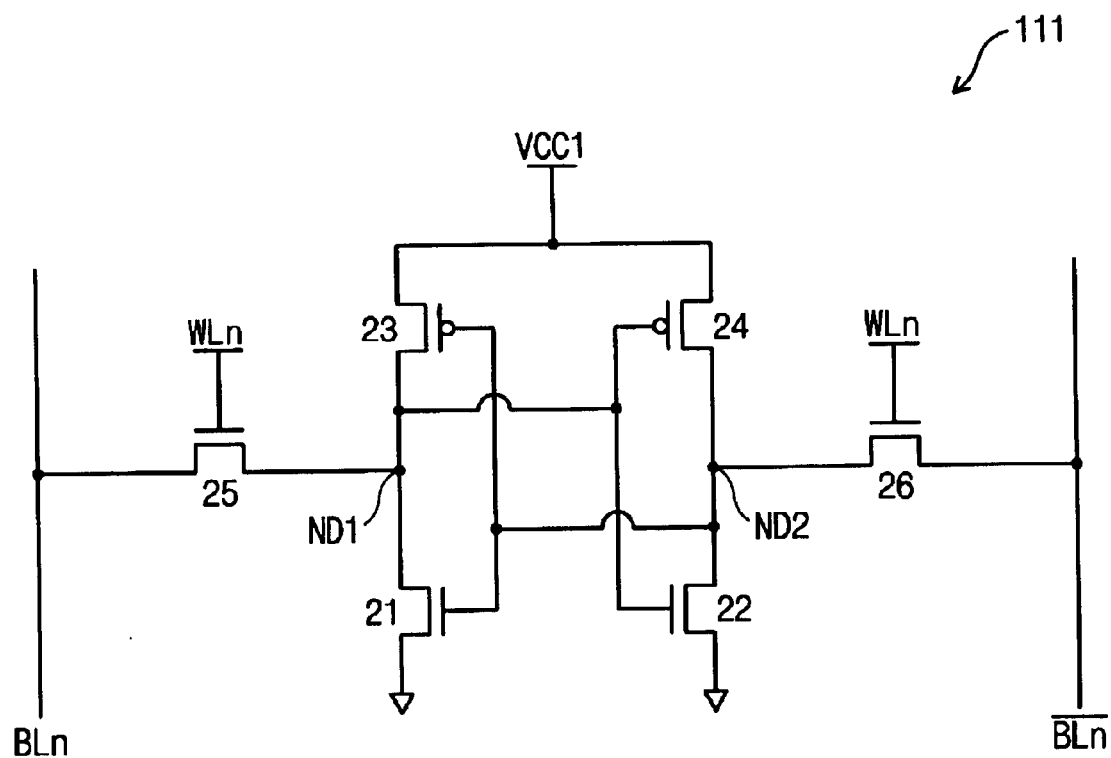
FIG. 5 is a circuit diagram showing a voltage condition of a memory cell in a wafer-burn test operation mode.

Referring now to FIG. 5, if the first power supply voltage VCC1 applied to the cell area is higher than the second power supply voltage VCC2 applied to the peripheral circuit area in the wafer burn-in operation mode, a voltage boosting degree at an ND1 node or ND2 node of memory cell 111 is lowered. This is due to the following. A voltage dropped by resistance elements of a ground line or a voltage applied to both ends of a ground line resistor is determined by the amount of current flowing through the ground line resistor. Therefore, since the power supply voltage supplied to the peripheral circuit area is lower than the power supply voltage supplied to the cell area, the amount of current flowing through the ground line resistor will be reduced. For that reason, a voltage of an ND1 or ND2 node having a ground level in the wafer burn-in test operation mode is more reduced than in the prior art. Periods are decreased in which the PMOS transistor 23 or 34 and the NMOS transistor 21 or 22 are concurrently turned on. As a result, data is normally written to a memory cell without the foregoing latch-up phenomenon. This means that stresses are effectively applied to the memory cell.

Figure 6:
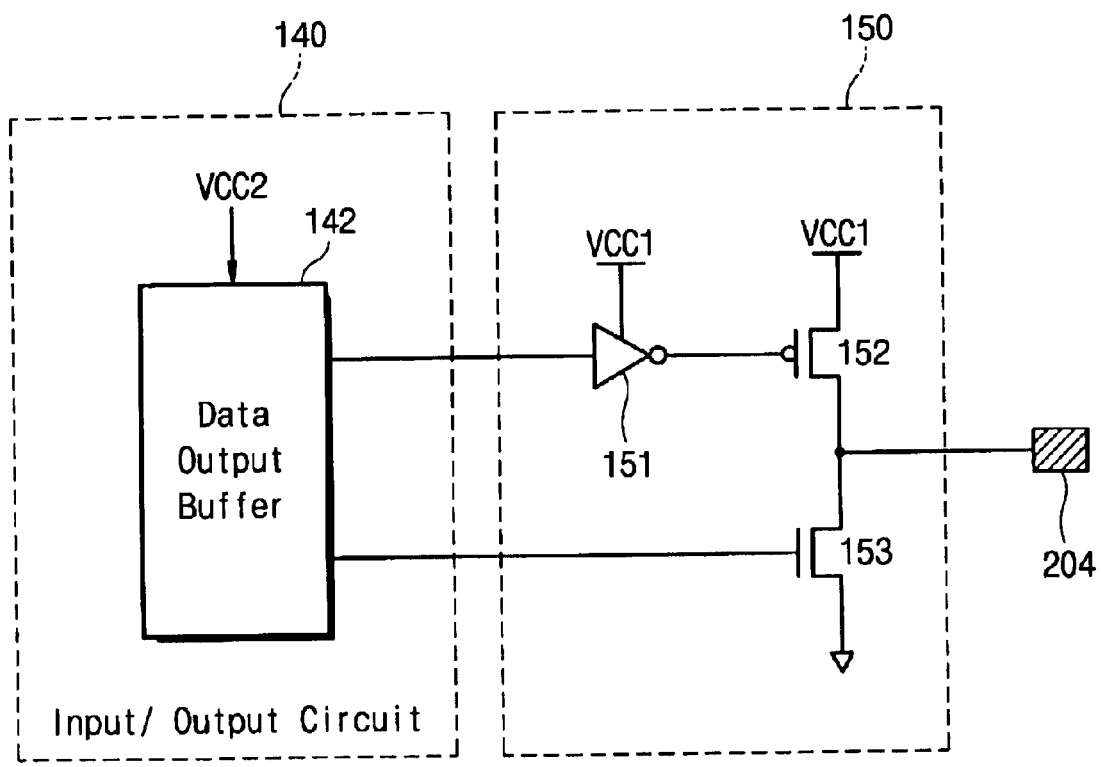
FIG. 6 is a circuit diagram of a part of a driver shown in FIG. 4.

A circuit diagram of the output driver circuit shown in FIG. 4 is illustrated in FIG. 6.

Referring now to FIG. 6, an output driver circuit 150 includes an inverter 151, a PMOS transistor 152, and an NMOS transistor 153. Unlike a data output buffer 142 in the input/output circuit 140, the inverter 151 and the PMOS transistor 152 receive the first power supply voltage VCC1. The inverter 151 utilizing the first power supply voltage VCC1 is used for shutting off a DC current flowing through the PMOS transistor 152 in the burn-in test operation mode. For example, in a case where the second power supply voltage VCC2 (3V to 4V) is applied to a gate terminal of the PMOS transistor 152 and the first power supply voltage VCC1 (5V) is applied to a source terminal thereof in the wafer burn-in test operation mode, the PMOS transistor 152 is not sufficiently turned off. In order to sufficiently turn off the PMOS transistor 152, an equivalent voltage must be applied to the gate terminal and the source terminal of the PMOS transistor 152. Thus, the inverter 151 utilizing the first power supply voltage VCC1 is coupled to the gate terminal of the PMOS transistor 152. As a pull-up element, the PMOS transistor 152 must maintain a turn-off state while the wafer burn-in test operation is performed.

To shut off the DC current flowing through the PMOS transistor 152 in the burn-in test operation mode, the second power supply voltage VCC2 may be supplied to the inverter 151 and the PMOS transistor 152, instead of the first power supply voltage VCC1.

Figure 7:
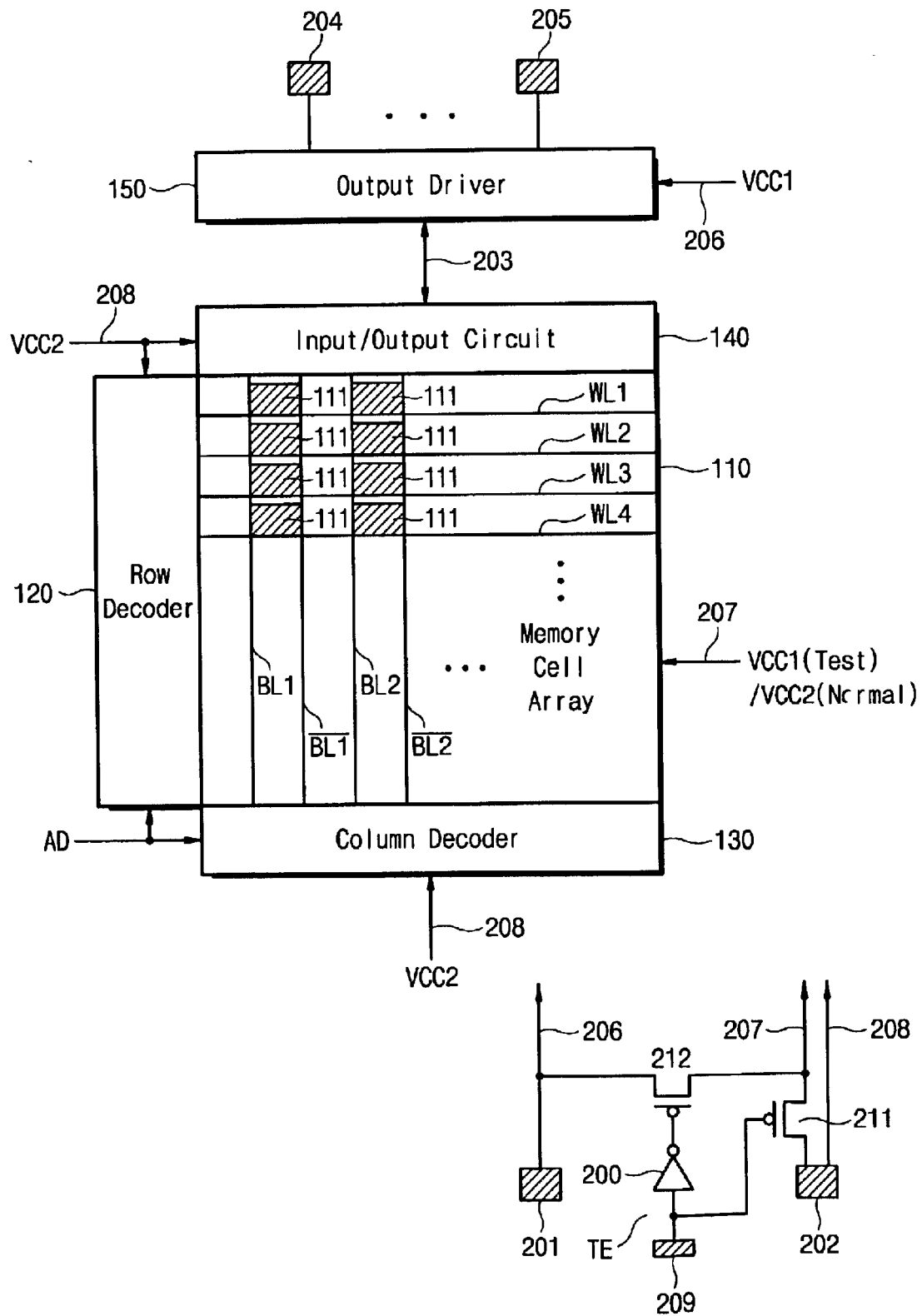
FIG. 7 is a block diagram of a semiconductor memory device according to another preferred embodiment of the present invention.

FIG. 7 is a block diagram of a semiconductor memory device according to another preferred embodiment of the invention, in which like numerals denote like components of FIG. 4. Except for a few differences, a semiconductor memory device of FIG. 7 is substantially identical to that of FIG. 4. The differences therebetween are described as follows. Although the same power supply voltage is used, a power supply line for supplying a power supply voltage to a cell area is separated from a power supply line for supplying a power supply voltage to an output driver circuit. In the case of an SRAM made according to the invention, first and second power supply voltages have the same value in a normal operation mode, while having a different value in a wafer burn-in operation mode.

As shown in FIG. 7, a first power supply voltage VCC1 or a second power supply voltage VCC2 is applied to a memory cell array 110. That is, in a normal operation mode, the second power supply voltage VCC2 applied through a power supply pad 202 is provided to the memory cell array 110. In a wafer burn-in test operation mode, the first power supply voltage VCC1 applied through a power supply pad 201 is provided to the memory cell array 110. This may be accomplished by a switching circuit including an inverter 200 and PMOS transistors 211 and 212. When a test enable signal TE of low level is applied to a pad 209, the PMOS transistor 211 is turned on and the PMOS transistor 212 is turned off. Thus, the second power supply voltage VCC2 applied to the power supply pad 202 is provided to the memory cell array 110 through a power supply line 207. When a test enable signal TE of high level is applied to the pad 209, the PMOS transistor 211 is turned off and the PMOS transistor 212 is turned on. Thus, the first power supply voltage VCC1 applied to the power supply pad 201 is provided to the memory cell array 110 through the power supply line 207.

According to the description made so far, during a wafer burn-in test operation mode, a power supply voltage applied to a cell area is higher than a power supply voltage applied to a peripheral circuit area. For that reason, a DC current path formed by a latch-up phenomenon of a memory cell can be shut off. Therefore, it is possible to prevent normal memory cells from being damaged in the wafer burn-in test operation mode and to effectively apply stresses to the memory cells.

While the present invention has been described with reference to certain preferred embodiments, as will be apparent to those skilled in the art, certain changes and modifications can be made without departing from the scope of the invention as defined by the following claims.

What is claimed is:

1. A semiconductor memory device comprising:
    a storage area for storing data;
    a peripheral circuit area for writing/reading data to/from the storage area, wherein during a wafer burn-in test operation mode, a first operation voltage is applied to the storage area and a second operation voltage is applied to the peripheral circuit area, the first operation voltage having a different voltage than the second operation voltage; and
    a data input/output area for interfacing with external devices, wherein during the wafer burn-in test operation mode, the first operation voltage is used as an operation voltage of the data input/output area.

2. The semiconductor memory device of claim 1, wherein the storage area includes a plurality of wordlines, a plurality of bitlines, and a plurality of memory cells each being located at intersections of the wordlines and the bitlines, and
    wherein each of the memory cells includes an SRAM cell of six transistors.

3. The semiconductor memory device of claim 1, wherein during a normal operation mode, the first operation voltage is equal to the second operation voltage.

4. The semiconductor memory device of claim 1, wherein during the wafer burn-in operation mode, the second operation voltage is lower than the first operation voltage.

5. A semiconductor memory device comprising:
    a storage area for storing data;
    a peripheral circuit area for writing/reading data to/from the storage area,
    wherein during a wafer burn-in test operation mode, a first operation voltage is applied to the storage area and a second operation voltage is applied to the peripheral circuit area, the first operation voltage having a different voltage than the second operation voltage; and
    the first and second operation voltages supplied in the wafer burn-in operation mode are higher than a normal operation voltage supplied to the memory device.

6. A semiconductor memory device comprising:
    a memory cell array including a plurality of wordlines, a plurality of bitlines, and a plurality of memory cells each being located at intersections of the wordlines and the bitlines;
    a row decoder circuit for selecting one of the wordlines in response to a row address;
    a column decoder circuit for selecting at least one of pairs of the bitlines in response to a column address;
    a switching circuit for connecting a bitline pair selected by the column decoder circuit with a corresponding sense amplifier circuit; and
    an output driver circuit for driving a data pad based on an output of the sense amplifier circuit,
    wherein when a wafer burn-in test operation is carried out, a first operation voltage is applied to the memory cell array and the output driver circuit, and a second operation voltage is applied to the row decoder circuit, the column decoder circuit, the switching circuit, and the sense amplifier, the first operation voltage having a different voltage than the second operating voltage.

7. The semiconductor memory device of claim 6, wherein when a normal operation is carried out, the first operation voltage is equal to the second operation voltage.

8. The semiconductor memory device of claim 7, wherein the first and second operation voltages supplied in the wafer burn-in test operation mode are higher than an operation voltage supplied to the memory device in a normal operation mode.

9. The semiconductor memory device of claim 6, wherein during the wafer burn-in operation mode, the second operation voltage is lower than the first operation voltage.

10. The semiconductor memory device of claim 6, wherein the output driver circuit includes:
    an inverter for receiving a power supply voltage and inverting an output signal of the sense amplifier;
    a PMOS transistor switched according to an output of the inverter, the PMOS transistor being coupled between a power supply line for supplying the power supply voltage and the data pad; and
    an NMOS transistor switched according to a complementary signal of the output signal of the sense amplifier, the NMOS transistor being coupled between the data pad and a ground voltage line.

11. The semiconductor memory device of claim 10, wherein the power supply voltage is the first operation voltage.

12. The semiconductor memory device of claim 10, wherein the power supply voltage is the second operation voltage.

13. A semiconductor memory device comprising:
a first power supply pad;
a second power supply pad;
a cell area for storing data;
a peripheral circuit area for writing/reading data to/from the cell area;
a data input/output area for interfacing with external devices, the data input/output area being coupled to the peripheral circuit area;
a first power supply line for transferring a first power supply voltage supplied to the first power supply pad to the cell area;
second power supply line for transferring a second power supply voltage supplied to the second power supply pad to the peripheral circuit area, wherein during a wafer burn-in operation mode, the first power supply voltage supplied to the first power supply pad is higher than the second power supply voltage supplied to the second power supply pad; and
a third power supply line for transferring the first rower supply voltage supplied to the first power supply pad to the data input/output area, the third power supply line being coupled to the first power supply pad.

14. The semiconductor memory device of claim 13, wherein the storage area includes a plurality of wordlines, a plurality of bitlines, and a plurality of memory cells each being located at intersections of the wordlines and the bitlines, and
wherein each of the memory cells includes an SRAM cell of six transistors.

15. The semiconductor memory device of claim 13, wherein during a normal operation mode, the first power supply voltage is equal to the second power supply voltage.

16. A semiconductor memory device comprising:
a first power supply pad;
a second power supply pad;
a cell area for storing data;
a peripheral circuit area for writing/reading data to/from the cell area;
a first power supply line for transferring a first power supply voltage supplied to the first power supply pad to the cell area;
a second power supply line for transferring a second power supply voltage supplied to the second power supply pad to the peripheral circuit area,
wherein during a wafer burn-in operation mode, the first power supply voltage supplied to the first power supply pad is higher than the second power supply voltage supplied to the second power supply pad; and
the first and second power supply voltages supplied in the wafer burn-in test operation mode are higher than the first and second power supply voltages supplied to the memory device in a normal operation mode.

17. A semiconductor memory device comprising:
a first power supply pad;
a second power supply pad;
a cell area for storing data;
a peripheral circuit area for writing/reading data to/from the cell area;
a data input/output area for interfacing with external devices, the data input/output area being coupled to the peripheral circuit area;
a first power supply line for transferring a first power supply voltage supplied to the first power supply pad to the cell area, the first power supply line being coupled to the first power supply pad;
a second power supply line for transferring a second power supply voltage supplied to the second power supply pad to the peripheral circuit area, the second power supply line being coupled to the second power supply pad;
a third power supply line for transferring the first power supply voltage supplied to the first power supply pad to the data input/output area, the third power supply line being coupled to the first power supply pad; and
a switching circuit for connecting the first power supply line with one of the first and second power supply pads in response to a test enable signal.

18. The semiconductor memory device of claim 17, wherein the cell area includes a plurality of wordlines, a plurality of bitlines, and a plurality of memory cells each being located at intersections of the wordlines and the bitlines, and
wherein each of the memory cells includes an SRAM cell of six transistors.

19. The semiconductor memory device of claim 17, wherein during the normal operation mode, the first power supply voltage is equal to the second power supply voltage.

20. The semiconductor memory device of claim 17, wherein during a wafer burn-in operation mode, the first power supply voltage supplied to the first power supply pad is higher than the second power supply voltage supplied to the second power supply pad.

21. A semiconductor memory device comprising:
a memory cell array including a plurality of wordlines, a plurality of bitlines, and a plurality of memory cells each being located at intersections of the wordlines and the bitlines;
a row decoder circuit for selecting one of the wordlines in response to a row address;
a column decoder circuit for selecting at least one of pairs of the bitlines in response to a column address;
a switching circuit for connecting a bitline pair selected by the column decoder circuit with a corresponding sense amplifier;
an output driver circuit for driving a data pad based on an output of the sense amplifier, including:
an inverter for receiving the second power supply voltage and inverting an output signal of a data output buffer;
a PMOS transistor switched according to an output of the inverter, the PMOS transistor being coupled between the second power supply line for supplying the second power supply voltage and the data pad; and
an NMOS transistor switched according to a complementary signal of the output signal of the data output buffer, the NMOS transistor being coupled between the data pad and a ground voltage line;
a first power supply line for transferring a first power supply voltage supplied to a first power supply pad to the column and row decoder circuits, the sense amplifier, and the switching circuit;

a second power supply line for transferring a second power supply voltage supplied to a second power supply pad to the output driver circuit; and a third power supply line for transferring the first power supply voltage supplied to the first power supply pad to the memory cell array, the third power supply line being coupled to the first power supply pad.

22. The semiconductor memory device of claim 21, wherein when a normal operation is carried out, the first power supply voltage is equal to the second power supply voltage.

23. The semiconductor memory device of claim 21, wherein during a wafer burn-in test operation mode, the first power supply voltage supplied to the first power supply pad is higher than the second power supply voltage supplied to the second power supply pad.

24. A semiconductor memory device comprising:
a first power supply pad;
a second power supply pad;
a cell area for storing data;
a peripheral circuit area for writing/reading data to/from the cell area;
a data input/output area for interfacing with external devices, the data input/output area being coupled to the peripheral circuit area;
a first power supply line for transferring a first power supply voltage supplied to the first power supply pad to the cell area, the first power supply line being coupled to the first power supply pad;
a second power supply line for transferring a second power supply voltage supplied to the second power supply pad to the peripheral circuit area, the second power supply line being coupled to the second power supply pad;
a third power supply line for transferring one of the first and second power supply voltages to the cell area; and
a switching circuit for connecting the first power supply line with one of the first and second power supply pads in response to a test enable signal indicating a wafer burn-in test operation mode.

25. The semiconductor memory device of claim 24, wherein the third power supply line is coupled to the second power supply pad when the test enable signal is activated, and is coupled to the first power supply pad when the test enable signal is inactivated.

26. The semiconductor memory device of claim 25, wherein during the wafer burn-in test operation mode, the second power supply voltage supplied to the second power supply pad is higher than the first power supply voltage supplied to the first power supply pad.

27. The semiconductor memory device of claim 25, wherein during a normal operation mode, the first power supply voltage is equal to the second power supply voltage.

28. The semiconductor memory device of claim 25, wherein the first and second power supply voltages supplied during the wafer burn-in test operation mode are higher than the first and second power supply voltages supplied to the memory device during a normal operation mode.

29. The semiconductor memory device of claim 24, wherein the cell area includes a plurality of wordlines, a plurality of bitlines, and a plurality of memory cells each being located at intersections of the wordlines and the bitlines, and
wherein each of the memory cells includes an SRAM cell of six transistors.

30. A semiconductor memory device comprising:
a memory cell array including a plurality of wordlines, a plurality of bitlines, and a plurality of memory cells each being located at intersections of the wordlines and the bitlines;
a row decoder circuit for selecting one of the wordlines in response to a row address;
a column decoder circuit for selecting at least one of pairs of the bitlines in response to a column address;
a switching circuit for connecting a bitline pair selected by the column decoder circuit with a corresponding sense amplifier;
an output driver circuit for driving a data pad based on an output of the sense amplifier;
a first power supply line for transferring a first power supply voltage supplied to a first power supply pad to the column and row decoder circuits, the sense amplifier, and the switching circuit;
a second power supply line for transferring a second power supply voltage supplied to a second power supply pad to the output driver circuit;
a third power supply line for transferring one of the first and second power supply voltages to the memory cell array; and
a switching circuit for connecting the third power supply line with one of the first and second power supply pads in response to a test enable signal indicating a wafer burn-in test operation mode.

31. The semiconductor memory device of claim 30, wherein the third power supply line is coupled to the second power supply pad when the test enable signal is activated, and is coupled to the first power supply pad when the test enable signal is inactivated.

32. The semiconductor memory device of claim 31, wherein during the wafer burn-in test operation mode, the second power supply voltage supplied to the second power supply pad is higher than the first power supply voltage supplied to the first power supply pad.

33. The semiconductor memory device of claim 31, wherein during a normal operation mode, the first power supply voltage is equal to the second power supply voltage.

34. The semiconductor memory device of claim 31, wherein the first and second power supply voltages supplied in the wafer burn-in test operation mode are higher than the first and second power supply voltages supplied to the memory device in a normal operation mode.

35. The semiconductor memory device of claim 30, wherein each of the memory cells includes an SRAM cell of six transistors.

36. The semiconductor memory device of claim 30, wherein the output driver circuit includes:
an inverter for receiving the second power supply voltage and inverting an output signal of the sense amplifier;
a PMOS transistor switched according to an output of the inverter, the PMOS transistor being coupled between the second power supply line for receiving the second power supply voltage and the data pad; and
an NMOS transistor switched according to a complementary signal of the output signal of the sense amplifier, the NMOS transistor being coupled between the data pad and the ground voltage line.

37. A test method of a semiconductor memory device including a storage area for storing data, a peripheral circuit area for writing/reading data to/from the storage area, and an input/output area that is coupled to the peripheral circuit area and interfaces with external devices, the test method comprising the steps of:

making the semiconductor memory device enter a wafer burn-in test operation mode; and writing data to the storage area by supplying a first operation voltage to the storage area and supplying a second operation voltage to the peripheral circuit area, wherein the second operation voltage is lower than the first operation voltage.

38. The test method of claim 37, wherein during the wafer burn-in test operation mode, the first operation voltage is supplied as an operation voltage of the data input/output area.

39. The test method of claim 37, wherein the storage area includes SRAM cells each including six transistors.

40. The test method of claim 37, wherein during a normal operation mode, the first operation voltage is equal to the second operation voltage.

41. The test method of claim 37, wherein first and second operation voltages supplied in the wafer burn-in test operation mode are higher than an operation voltage supplied to the memory device in a normal operation mode.

* * * * *